(12) United States Patent
Miller et al.

(10) Patent No.: US 8,816,428 B1
(45) Date of Patent: Aug. 26, 2014

(54) MULTIGATE DEVICE ISOLATION ON BULK SEMICONDUCTORS

(71) Applicants: International Business Machines Corporation, Armonk, NY (US); Global Foundries Inc., Cayman Islands (KY)

(72) Inventors: Robert J. Miller, Yorktown Heights, NY (US); Tenko Yamashita, Schenectady, NY (US); Hui Zang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/905,850

(22) Filed: May 30, 2013

(51) Int. Cl.
H01L 29/78 (2006.01)
H01L 21/336 (2006.01)
H01L 21/762 (2006.01)

(52) U.S. Cl.
USPC ............ 257/329; 257/365; 257/E29.262; 257/E29.264; 438/156; 438/157

(58) Field of Classification Search
None
See application file for complete search history.

(56) References Cited

U.S. PATENT DOCUMENTS

| | | | |
|---|---|---|---|
| 6,635,583 B2 | 10/2003 | Bencher et al. | |
| 6,800,518 B2 | 10/2004 | Bendernagel et al. | |
| 7,101,763 B1 | 9/2006 | Anderson et al. | |
| 7,517,764 B2 * | 4/2009 | Booth et al. | 438/300 |
| 7,871,873 B2 | 1/2011 | Maszara et al. | |
| 7,947,589 B2 | 5/2011 | Muralidhar et al. | |
| 8,101,486 B2 | 1/2012 | Maszara et al. | |
| 8,334,177 B2 | 12/2012 | Maszara et al. | |
| 2012/0181605 A1 | 7/2012 | Grisham et al. | |
| 2012/0264267 A1 | 10/2012 | Lu et al. | |
| 2013/0009246 A1 | 1/2013 | Cheng et al. | |

OTHER PUBLICATIONS

Hisamoto, D., et al. "Impact of the Vertical Soi 'Delta' Structure on Planar Device Technology" IEEE Transactions on Electron Devices. vol. 38. No. 6. Jun. 1991. pp. 1419-1424.
Hisamoto, D., et al. "A Fully Depleted Lean-Channel Transistor (Delta)—A Novel Vertical Ultrathin SOI MOSFET" IEEE Electron Device Letters vol. 11. No. 1. Jan. 1990. pp. 36-38.
Wu, B., et al. "High Aspect Ratio Silicon Etch: A Review" Journal of Applied Physics. vol. 108. No. 5. Sep. 2010. (20 Pages).
Hisamoto, D., et al. "A Fully Depleted Lean-Channel Transistor (Delta)—A Novel Vertical Ultrathin SOI MOSFET" IEEE Electron Devices Society. 1989. (4 Pages).

\* cited by examiner

*Primary Examiner* — Davienne Monbleau
*Assistant Examiner* — Joseph Schoenholtz
(74) *Attorney, Agent, or Firm* — Tutunjian & Bitetto, P.C.; Vazken Alexanian

(57) ABSTRACT

Methods and systems for forming multigate devices and systems are disclosed. In accordance with one such method, a fin is formed on a semiconductor substrate including a carbon-doped semiconductor layer. Further, a first portion of semiconductor material that is beneath the fin is removed to form a void beneath the fin by etching the material such that the fin is supported by at least one supporting pillar of the semiconducting material and such that the carbon-doped semiconductor layer prevents the etching from removing at least a portion of the fin. A dielectric material is deposited in the void to isolate the fin from a second portion of semiconductor material that is below the void. In addition, source and drain regions are formed in the fin and a gate structure is formed over the fin to fabricate the multigate device such that the dielectric material reduces current leakage beneath the device.

20 Claims, 10 Drawing Sheets

US 8,816,428 B1

MULTIGATE DEVICE ISOLATION ON BULK SEMICONDUCTORS

BACKGROUND

1. Technical Field

The present invention relates to multigate devices, and more particularly to dielectric isolation in multigate devices.

2. Description of the Related Art

Throughout the evolution and advancement of computing devices, reducing their size and their power consumption while maintaining a high processing capacity have long been design goals. Transistors have been the cornerstone of electrical circuits of computing devices. A common transistor type is field-effect transistors (FET), in which the conductivity of a channel between terminals of the transistor is dependent on electric fields. Basic elements of an FET include a gate, a source and a drain, which are connected to conductive lines that control their operation through contacts. Planar FET transistors, which have been widely used in integrated circuits for the past several decades, were found to be increasingly inefficient on the nanometer scale. Reducing the size of the channel between the terminals of planar transistors to this scale leads to an inefficient leakage of current in the off-state of the transistor, resulting in an increase in power consumption in its idle state. Multiple gate (Multigate) field-effect transistors have been developed to address this problem, as they incorporate several gates that surround the channel between a source and drain terminal of the transistor on a plurality of surfaces, thereby enabling the suppression of leakage current in the off-state.

There are several different types of multigate devices. FinFETs and Trigate devices are two examples. FinFET devices include a thin fin, which can be made of silicon, that provides the channel between a source and a drain. The fin can be overlaid with one or more pairs of gates, where the gates in a pair are on opposing sides of the fin. Trigates are similar to FinFETs in that they also employ fins. However, in a Trigate device, two vertical gates respectively envelop two separate fins and a single top gate is overlaid on the two vertical gates. The top gate usually extends across a plurality of transistor cells in trigate devices.

SUMMARY

One exemplary embodiment is directed to a method for forming a multigate device. In accordance with the method, a fin is formed on a semiconductor substrate including a carbon-doped semiconductor layer. Further, a first portion of semiconductor material that is beneath the fin is removed to form a void beneath the fin by etching the material such that the fin is supported by at least one supporting pillar of the semiconducting material and such that the carbon-doped semiconductor layer prevents the etching from removing at least a portion of the fin. A dielectric material is deposited in the void to isolate the fin from a second portion of semiconductor material that is below the void. In addition, source and drain regions are formed in the fin and a gate structure is formed over the fin to fabricate the multigate device such that the dielectric material reduces current leakage beneath the device.

Another exemplary embodiment is directed to a multigate device including a fin, a gate structure, a carbon-doped semiconductor layer and a dielectric material. The fin includes a source, a drain and a channel region that provides a conductive channel between the source and the drain of the fin. The gate structure envelops a plurality of surfaces of the fin and is configured to activate the conductive channel. The carbon-doped semiconductor layer is disposed beneath the fin and the dielectric material is disposed beneath the carbon-doped semiconductor layer and is configured to prevent current leakage beneath the device.

Another exemplary embodiment is directed to a multigate system including a plurality of multigate devices, a dielectric material and a carbon-doped semiconductor layer. Each of the multigate devices includes a fin including a source, a drain and a channel region that provides a conductive channel between the source and the drain of the device, and further includes a gate structure enveloping a plurality of surfaces of the fin that is configured to activate the conductive channel. The dielectric material is disposed beneath each of the fins and is configured to prevent current leakage beneath the devices. Further, the carbon-doped semiconductor layer is disposed beneath the dielectric material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
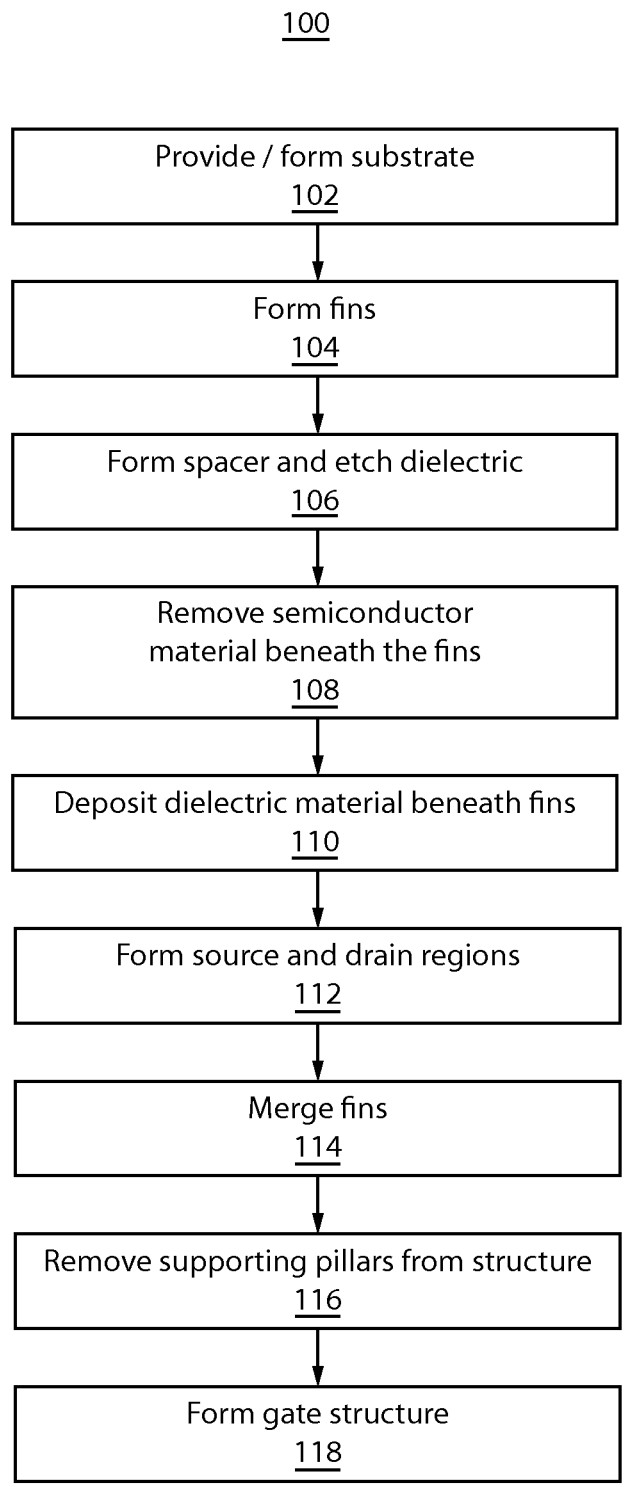
FIG. 1 is a block diagram of a method for forming a multigate system and multigate devices in accordance with an exemplary embodiment.

Multigate devices are commonly formed on a bulk semiconductor substrate or wafer due to the relatively low cost of the substrate/wafer. However, a common problem with fabrication of multigate devices on bulk substrates is that current leakage beneath the channel region of the device, and at source and drain junctions, are difficult to control. To address the problem, exemplary embodiments of the present invention provide novel methods that can completely isolate the fins of a multigate device beneath the channel regions and at source/drain junctions. Preferred embodiments remove semiconductor material beneath the fins in its entirety and deposit a dielectric material to implement the isolation.

Removal of the semiconductor material beneath the fins may present difficulties with controlling fin heights and difficulties in forming insulating material beneath the fins. For example, during removal of the semiconductor material beneath the fins, some fins may have more material removed than others, thereby resulting in devices that have inconsistent fin heights and different corresponding electrical properties. Similarly, such inconsistent removal may result in inconsistent deposition of dielectric material, which can lead to the formation of voids and possibly shorts. Thus, one particular advantageous aspect of the embodiments described herein is that the removal of the semiconductor material can be performed such that the fin height and insulator formation can be precisely controlled. Here, embodiments can employ one or more carbon-doped semiconductor layers that are epitaxially grown on top of a bulk semiconductor substrate/wafer and are advantageously positioned to protect the fins and/or the underlying substrate during the removal. For example, one such layer may be positioned at the bottom of the fins and another can be formed at the bottom of the isolating dielectric material. Thus, by protecting the fins and the bulk semiconducting material in this way, the fins can maintain a consistent fin height and the deposited dielectric can be consistently formed.

As will be appreciated by one skilled in the art, aspects of the present invention may be embodied as a system, method or device. Aspects of the present invention are described below with reference to flowchart illustrations and/or block diagrams of methods, apparatus (systems) and devices according to embodiments of the invention. It will be understood that each block of the flowchart illustrations and/or block diagrams, and combinations of blocks in the flowchart illustrations and/or block diagrams illustrate the architecture, functionality, and operation of possible implementations of systems, methods and devices according to various embodiments of the present invention. In this regard, it should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware and mechanical-based systems that perform the specified functions or acts.

It is to be understood that the present invention will be described in terms of a given illustrative architecture having a wafer; however, other architectures, structures, substrate materials and process features and steps may be varied within the scope of the present invention.

It will also be understood that when an element is referred to as being "on" or "over" another element, it can be directly on the other element or intervening elements may also be present. In contrast, when an element is referred to as being "directly on" or "directly over" another element, there are no intervening elements present. Similarly, it will also be understood that when an element is referred to as being "beneath" or "below" another element, it can be directly beneath the other element or intervening elements may also be present. In contrast, when an element is referred to as being "directly beneath" or "directly below" another element, there are no intervening elements present. Further, the term "beneath" with respect to an element should be understood to mean below the element in a perpendicular line between the element and the feature described as being beneath an element. Thus, the term "beneath" should not be understood to mean that a feature is only in a different plane with respect to the element. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present invention may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a method 100 for fabricating one or more multigate devices is illustratively depicted. Reference is also made to FIGS. 2-18, illustrating various structures during processing stages of the method 100. It should be noted that, although the embodiments are discussed herein with respect to finFET devices and systems, the aspects described herein can also be applied to other types of multigate devices, including, for example, Trigate devices.

Figure 2:
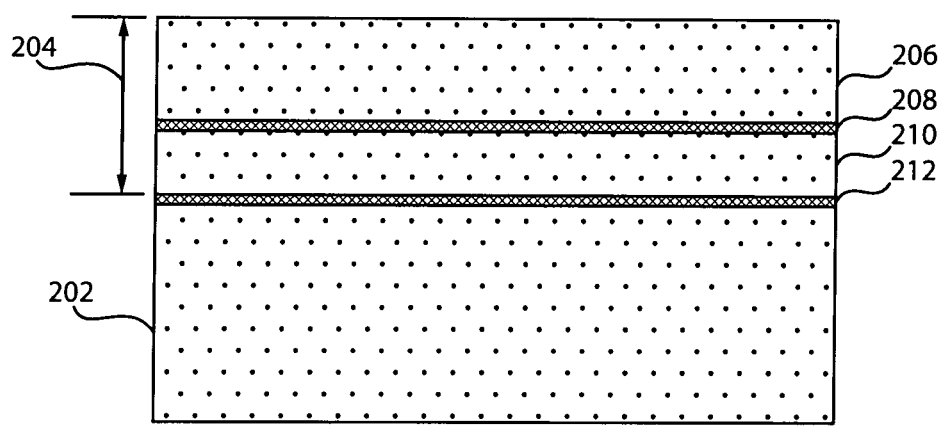
FIG. 2 is a cross-sectional view of a substrate including a plurality of carbon-doped semiconductor layers in accordance with an exemplary embodiment.
Figure 3:
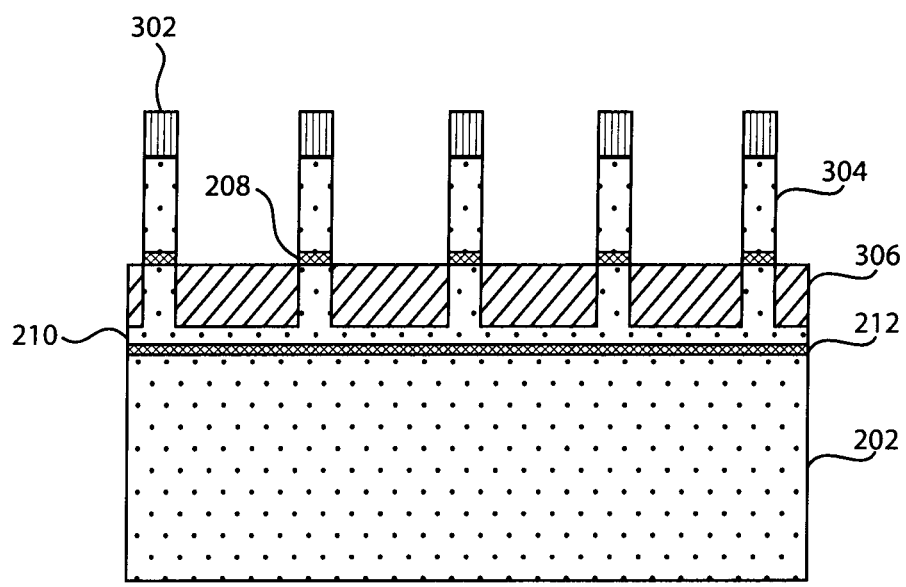
FIG. 3 is a cross-sectional view of a structure illustrating the formation of fins of multigate devices in accordance with an exemplary embodiment.

The method can begin at step 102, at which a substrate or wafer 200 can be provided or formed. For example, as illustrated in FIG. 2, a multilayer structure 204 can be epitaxially grown on a bulk semiconductor substrate 202, such as a bulk silicon substrate in the preferred embodiment. The structure 204 can be formed by growing a first carbon-doped semiconductor layer 212, growing a first semiconductor layer 210 on top of the carbon-doped semiconductor layer 212, growing a second carbon-doped layer 208 on top of the semiconductor layer 210 and growing a second semiconductor layer 206 on top of the carbon-doped layer 208. The carbon-doped layers 208 and 212 can be silicon layers that preferably have about 1% carbon dispersed therein. The atomic percentage of carbon in layers 208 and 212 should be between 1%-3%, which has been found to be an ideal balance with respect to improving wet etching selectivity while at the same time maintaining ease of epitaxial growth of the carbon-doped layers. Here, the carbon-doped layers need not have the same percentage of carbon, but can have different values within, for example, the preferred range. A single crystalline SiC layer 212 can be epitaxially grown on the bulk substrate 202, followed by another single crystalline epitaxial growth of a silicon layer 210 on the layer 212. These processes can be repeated to form SiC layer 208 and Si layer 206. Here, the semiconductor material of each of the layers 202-212 is preferably composed of silicon. However, the semiconductor material of each of the layers 202-212 can be composed of Si, SiGe and/or Ge in accordance with exemplary embodiments of the present invention.

At step 104, fins can be formed in the structure 200 and dielectric material can be deposited between the fins. For example, as illustrated by structure 300 of FIG. 3, a silicon nitride mask 302 can be formed and the fins 304 can be formed in accordance with standard photolithographic methods. In addition, a flowable oxide 306, such as, for example, $SiO_2$, can be deposited. Here, the dielectric 306 can be formed to enable formation of a spacer about the fins in the following step. To enable deposition of the dielectric material 306, wet etching or dry etching of the carbon-doped semiconductor material 208 can be employed in accordance with various embodiments. However, wet etching of SiC is difficult to perform from a practical point of view, as it involves the use of molten salts at high temperatures, for example, NaOH—KOH at 350° C. The difficulty encountered in etching SiC is a result of the high bond strength, a property which makes SiC useful for high-temperature operation, but an obstacle for fabrication. Nonetheless, dry etches can be employed to facilitate removal of SiC at portions of the structure 204. For example, reactive ion etching (RIE) of SiC in fluorinated plasmas and electron cyclotron resonance (ECR) etching can be performed. Sacrificial etch masks, for example, composed of aluminum, can be deposited and photolithographically patterned to protect desired areas of SiC from being etched.

Figure 4:
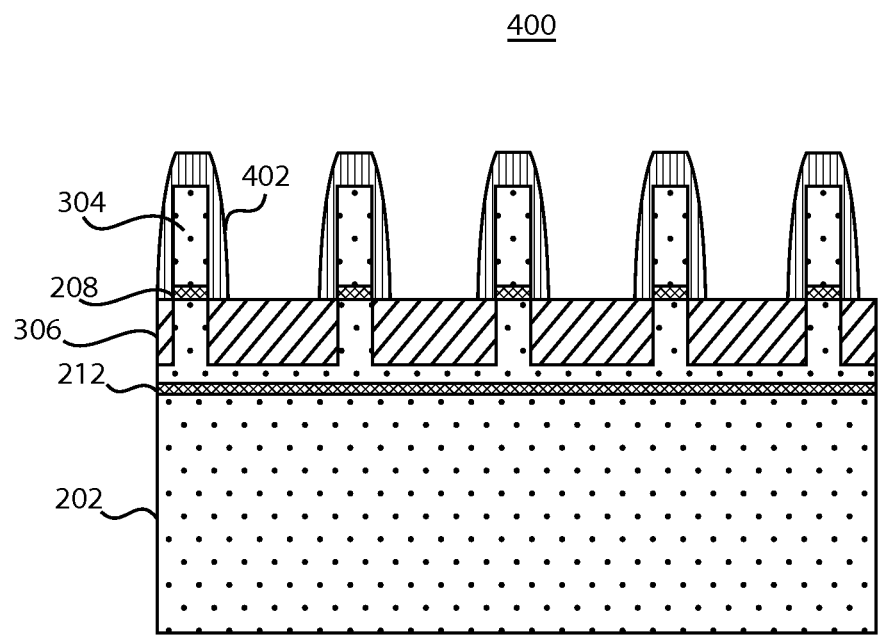
FIG. 4 is a cross-sectional view of a structure illustrating the formation of spacers on fins in accordance with an exemplary embodiment.
Figure 5:
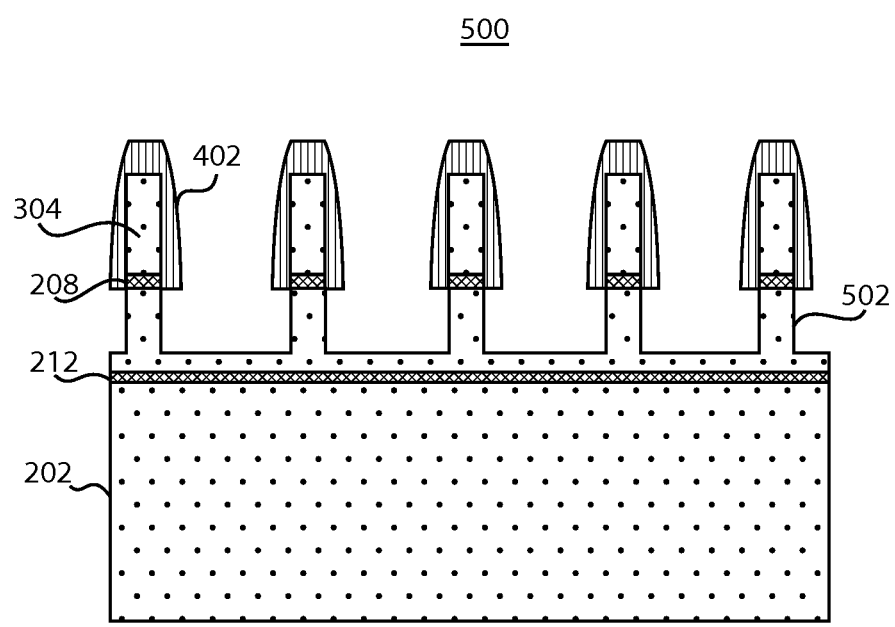
FIG. 5 is a cross-sectional view of a structure illustrating the removal of dielectric material to expose portions of a semiconductor material beneath fins of multigate devices in accordance with an exemplary embodiment.
Figure 6:
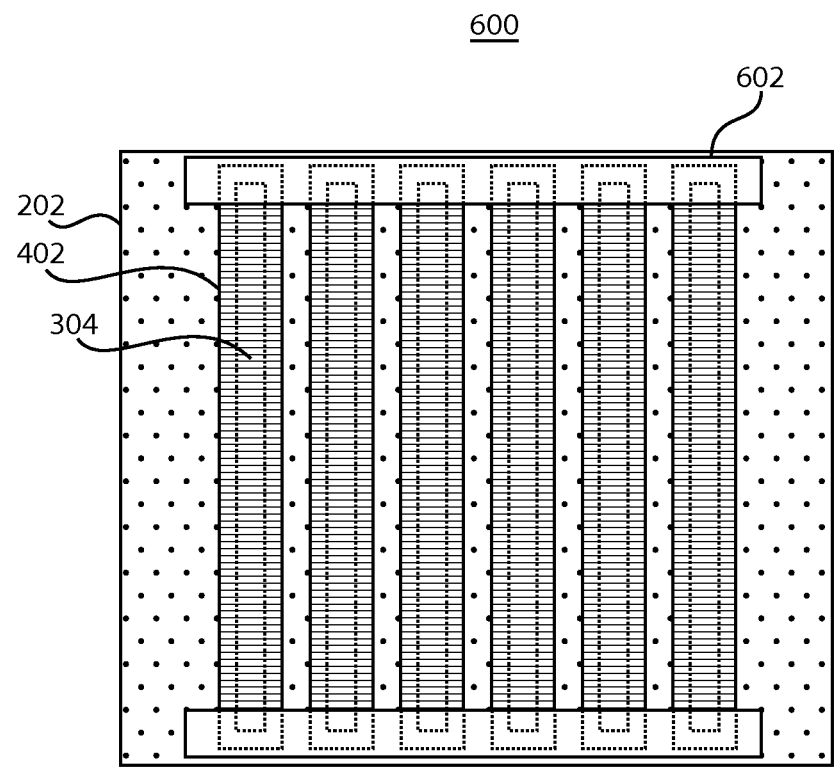
FIG. 6 is a cross-sectional view of a structure illustrating the formation of a photoresist over regions of fins of multigate devices to delineate supporting pillars in accordance with an exemplary embodiment.

At step 106, spacers 402 can be formed on the fins 304 for purposes of protecting the fins 304 during removal of semiconductor material beneath the fins 304, as, for example, illustrated by structure 400 of FIG. 4. The spacer 402 can be composed of silicon nitride, or any other suitable material that would protect the fins during subsequent etching steps that remove dielectric material between the fins and remove semiconductor material beneath the fins. Thereafter, the dielectric material formed between the fins can be etched. For example, as illustrated by structure 500 of FIG. 5, the flowable, deposition oxide 306 can be etched using dilute hydrofluoric acid.

Figure 7:
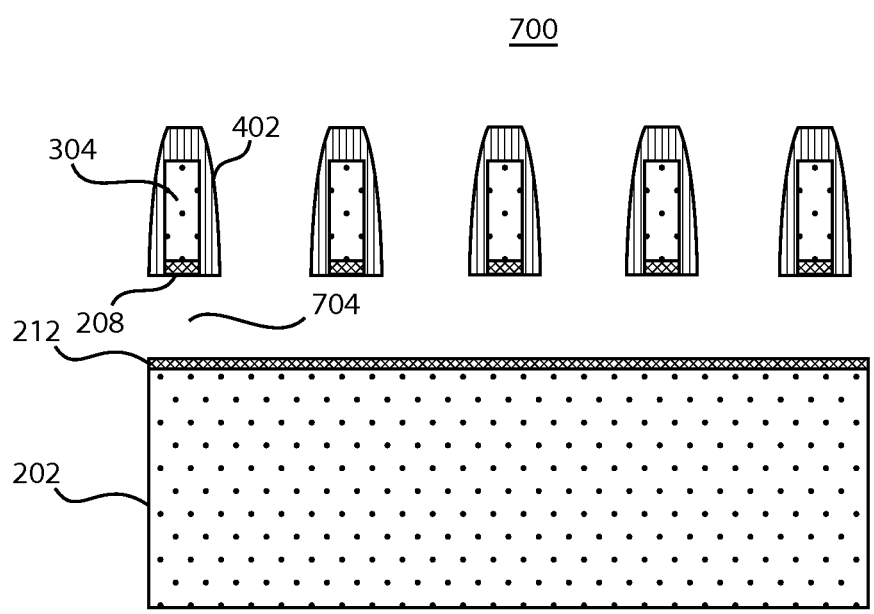
FIG. 7 is a cross-sectional view of a structure illustrating the removal of portions of a semiconductor material beneath fins of multigate devices to create voids beneath the fins in accordance with an exemplary embodiment.
Figure 8:
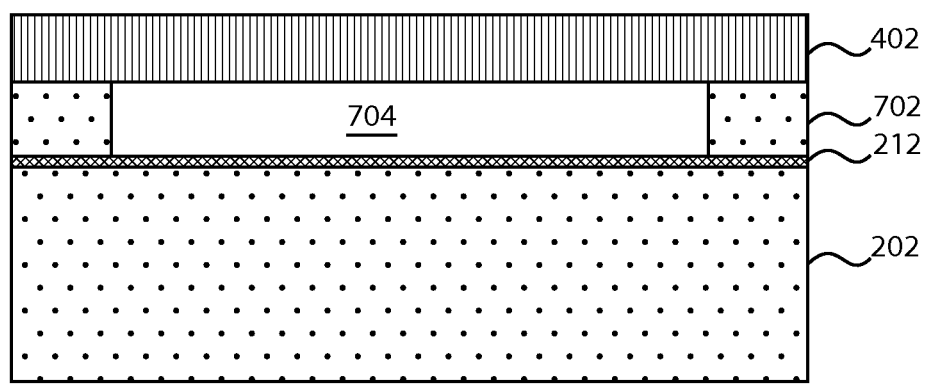
FIG. 8 is a cross-sectional side view of the structure illustrated in FIG. 7.
Figure 9:
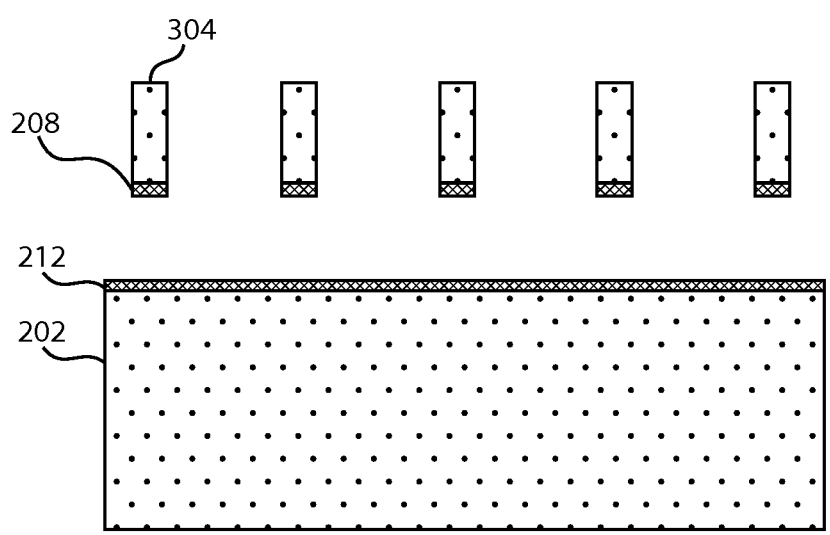
FIG. 9 is a cross-sectional view of a structure illustrating the removal of spacers of the fins of the structure of FIG. 7 in accordance with an exemplary embodiment.
Figure 10:
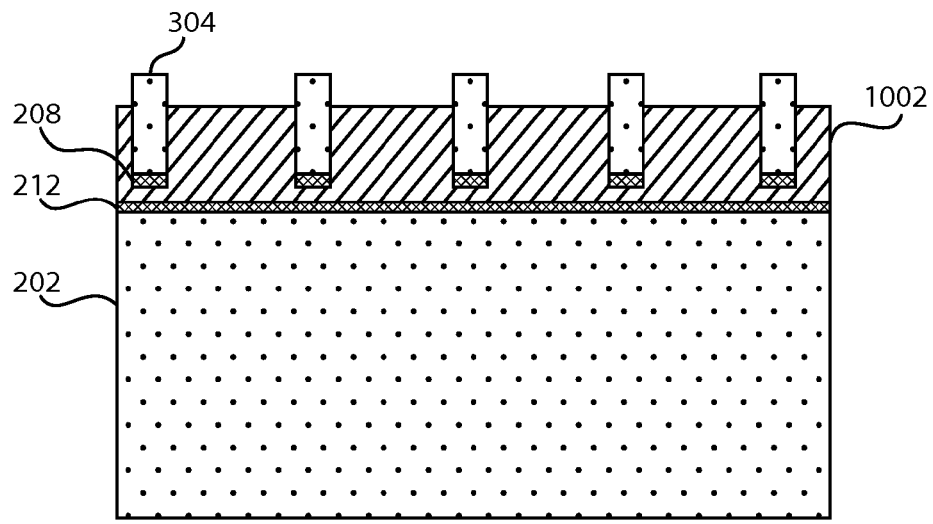
FIG. 10 is a cross-sectional view of a structure illustrating the deposition of a dielectric material within the voids illustrated in FIG. 9 in accordance with an exemplary embodiment.
Figure 11:
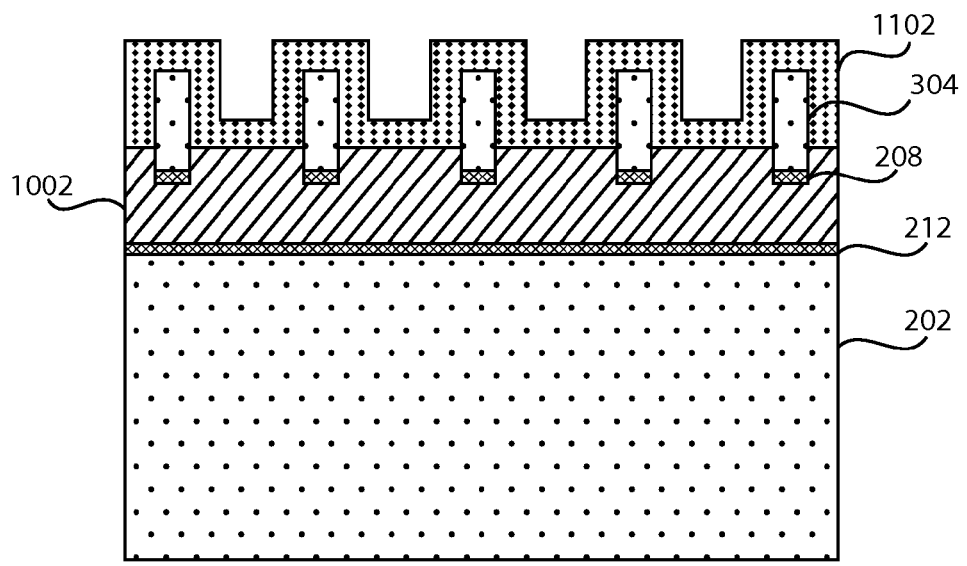
FIG. 11 is a cross-sectional view of a structure illustrating the formation of dummy gates over the fins illustrated in FIG. 10 in accordance with an exemplary embodiment.

At step 108, the semiconductor material beneath the fins can be removed. For example, as illustrated in FIGS. 5-8, a photo-resist 602 can be patterned, for purposes of forming supporting pillars 702, over the structure 500 to form structure 600. Thereafter, semiconductor material 502 beneath the fins 304 can be removed. For example, a silicon wet etch can be performed to remove the material 502 and create voids 704 beneath the fins 304, as illustrated in FIGS. 7-8. Thus, the fins 304 are essentially suspended and held up by supporting pillars 702. It should be noted that a diluted HF wet etch can be implemented for between 30-100 seconds at room temperature to remove the native oxide on the silicon material at step 106. Thereafter, at step 108, $NH_4ON$ can be employed at 65° C. to remove silicon selectively. The carbon-doped semiconductor layers 208 and 212 improve the wet-etch process window. For example, the carbon-doped semiconductor material 208 protects the fins 304 from the wet etch, thereby ensuring that material of the fins 304 above the layer 208 are not removed so that, throughout the etching, the fins 304 maintain a height consistent with that formed at step 104. Further, the carbon-doped semiconductor layer 212 protects the substrate 202 as well, ensuring that semiconductor material of the substrate 202 is not removed during the etching. The carbon-doped semiconductor layer 212 provides a consistent surface with a consistent height on which a dielectric material 1002 can be formed, as illustrated in FIG. 10. As noted above, the carbon-doped semiconductor layer 212 and its consistent height reduces the incidence of voids in the dielectric material 1002.

At step 110, a dielectric material can be deposited beneath the fins. For example, as illustrated by structure 900 in FIG. 9, the spacers 402 can be removed. In addition, a dielectric material 1002, which can be composed of a deposition oxide, such as $SiO_2$, can be deposited in voids 704 beneath the fins 304, as illustrated by structure 1000 of FIG. 10. The dielectric material 1002 is effective in isolating the multigate devices and their fins from the semiconducting material of the bulk semiconductor substrate 202. As stated above, the dielectric material 1002 is especially effective in preventing current leakage beneath the multigate devices formed in accordance with the method. Thus, because the semiconductor material beneath the fins have been removed and filled with the dielectric material, leakage current beneath the channel region of the fin and source/drain junction leakage current can be avoided. Further, the consistent height of the carbon-doped semiconductor layer 212 and its consistent surface enables a correspondingly consistent deposition of the dielectric material 1002, as it reduces the incidence of voids within the dielectric material 1002.

Figure 12:
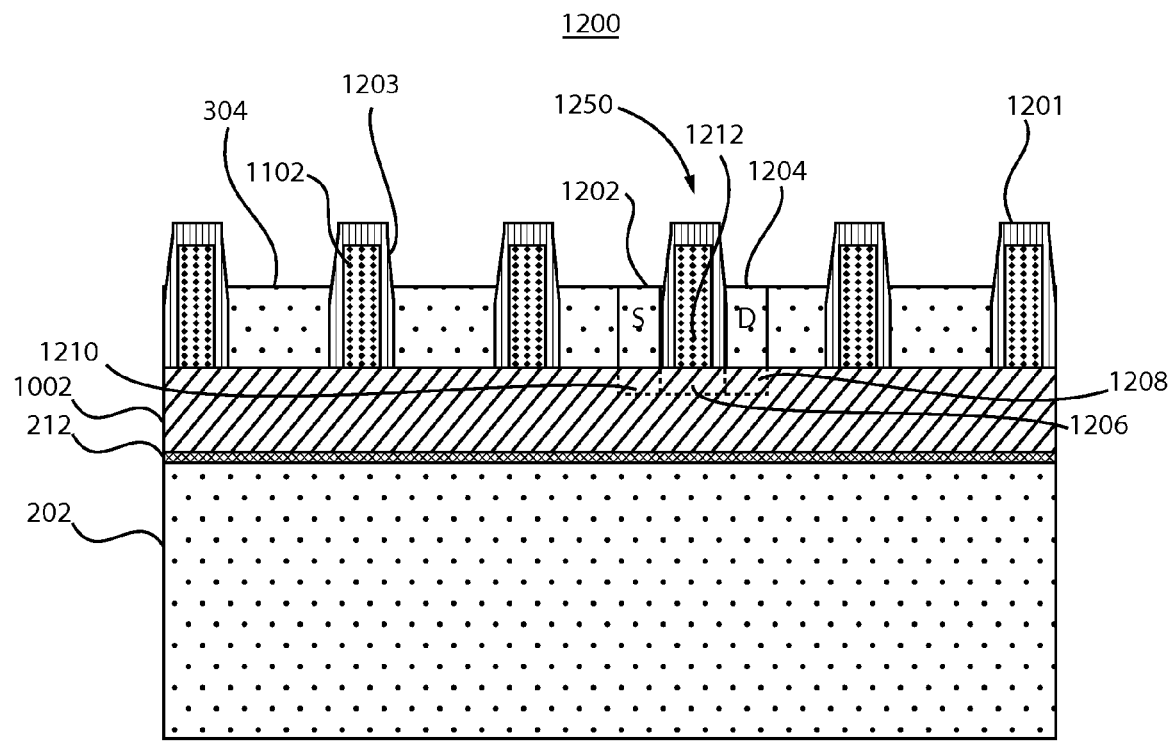
FIG. 12 is a cross-sectional side view of the structure illustrated in FIG. 11.

At step 112, source and drain regions can be formed in the fins. For example, as illustrated in structures 1100 and 1200 of FIGS. 11 and 12, respectively, a plurality of dummy gates 1102 can be formed over each of the fins 304. FIG. 12 provides a side view of the structure so that a cross-section of only one fin is shown. The dummy gates can be composed of polysilicon or any other suitable material. Further, silicon nitride caps 1201 and silicon nitride spacers 1203 can be formed over the dummy gates. Here, the dummy gates 1102 and the silicon nitride caps 1201 and spacers 1203 are formed to protect the portions of the fins about which gate structures will be subsequently formed. Further, as illustrated by the structure 1200, source regions 1202 and drain regions 1204 that will act as sources and drains of the various multigate devices formed in accordance with the method can be formed. For example, the source and drain regions can be formed by doping the fins in regions 1202 and 1204 via ion implantation. The doping can be implemented with appropriate p- or n-type dopants, such as, for example, boron and phosphorous, respectively, using any suitable doping process. Thus, structure 1250 denotes an area of the fin in which a particular multigate device will be formed with the subsequent formation of the gate structure for the device. In particular, the region 1212 of the fin 304 will correspond to the channel region that provides a conductive channel between the source 1202 and drain 1204 regions of the device. Similarly, regions 1210 and 1208 will correspond to the source junction and the drain junction, respectively. As noted above, the dielectric material is effective in reducing or eliminating current leakage in the region 1206 beneath the channel region 1212, currently leakage through the source junction 1210 and/or current leakage through the drain junction 1208. It should be noted that multiple sources and drains are formed about each of the dummy gates 1102 in each of the fins 304. However, for ease of illustration, only one pair of source and drain regions are shown.

Figure 13:
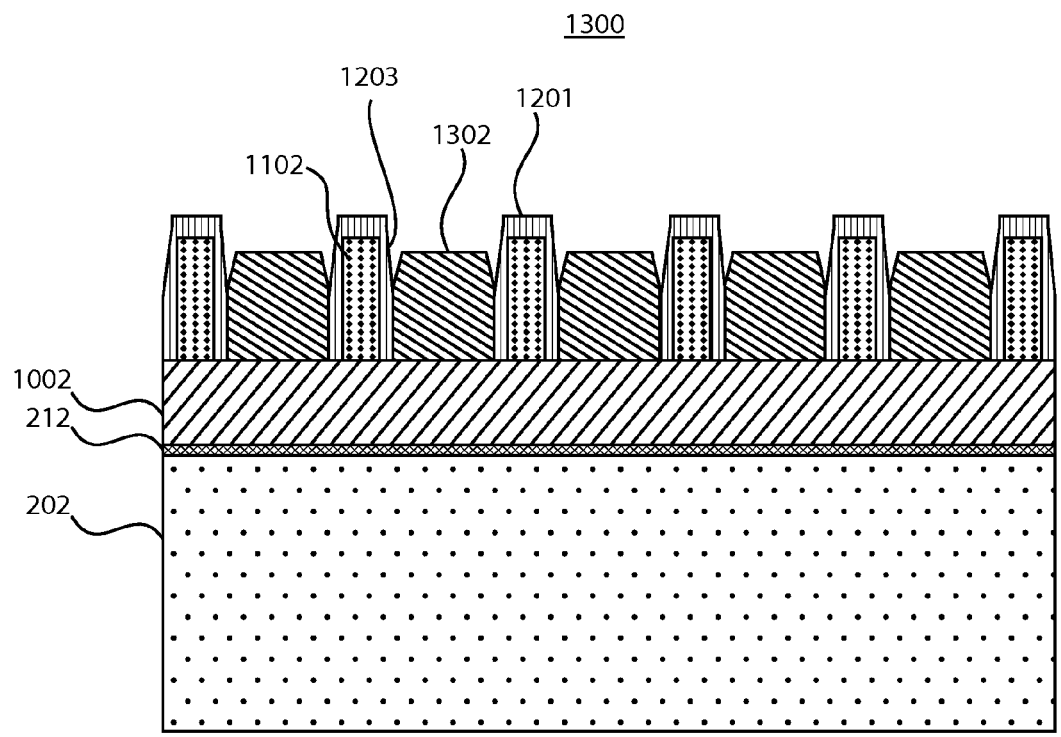
FIG. 13 is a cross-sectional view of a structure illustrating the formation of spacers about the dummy gates illustrated in FIG. 11 and also illustrating an epitaxial growth of semiconductor material that merges the fins of the structure in accordance with an exemplary embodiment.
Figure 15:
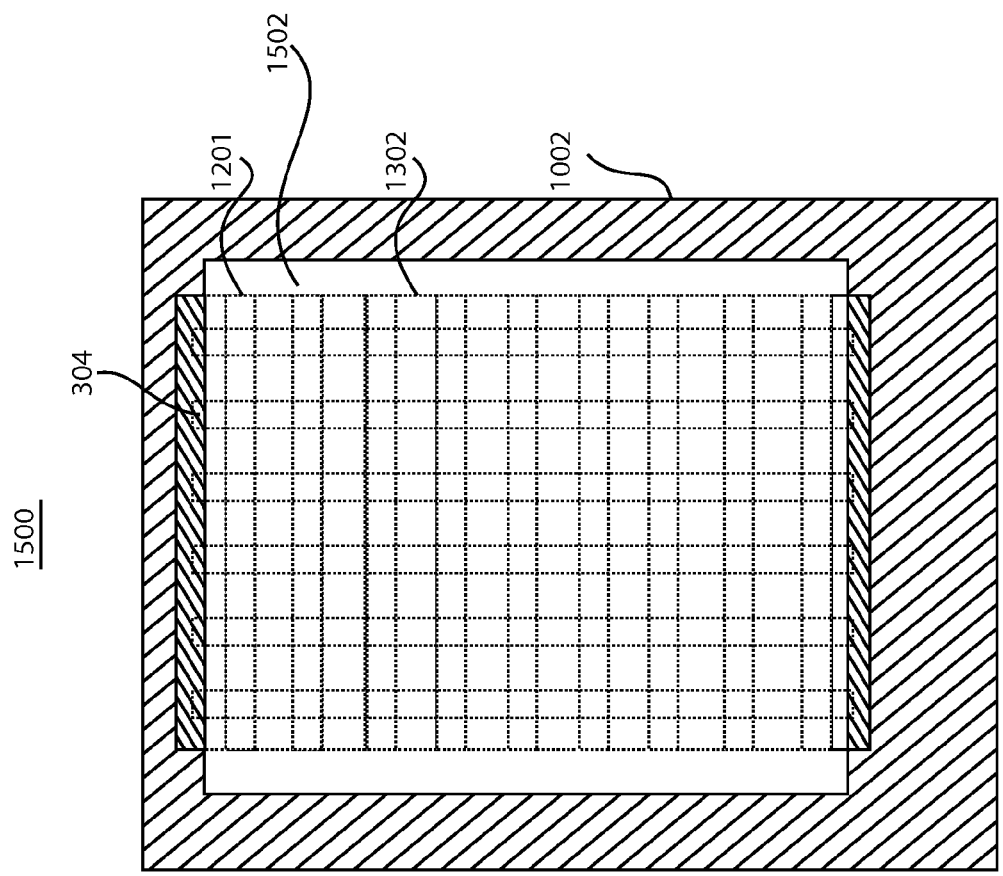
FIG. 15 is a top view of a structure illustrating the formation of a photoresist over regions of the structure illustrated in FIG. 13 to delineate the supporting pillars of the structure in accordance with an exemplary embodiment.
Figure 14:
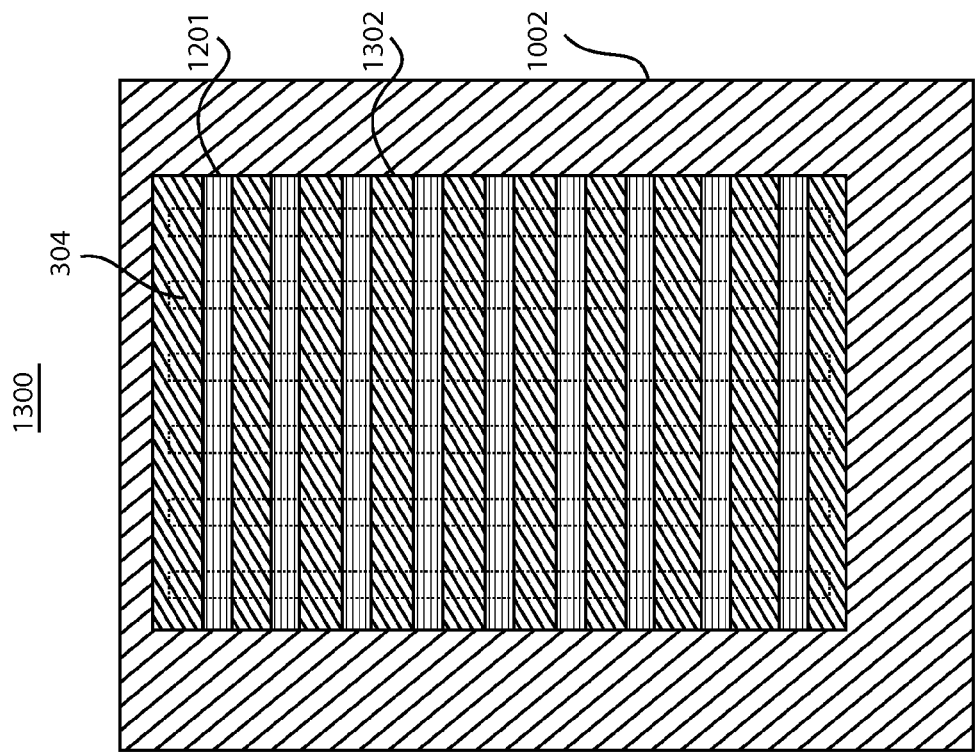
FIG. 14 is a top view of the structure illustrated in FIG. 13.
Figure 16:
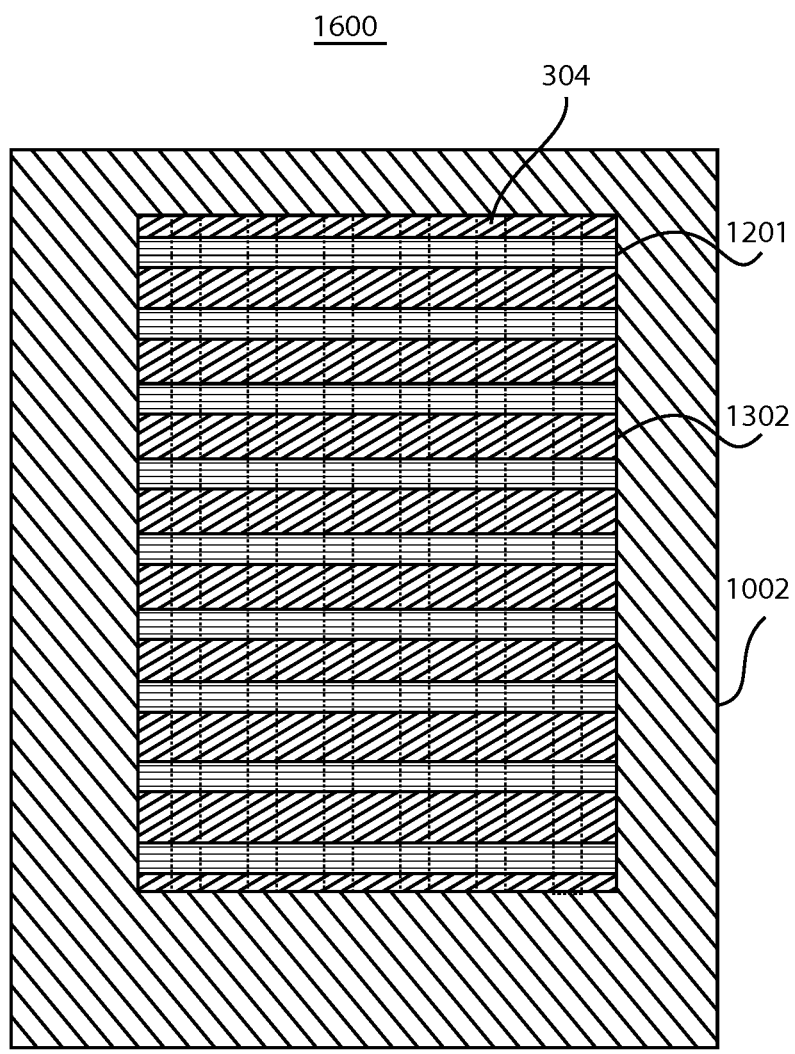
FIG. 16 is a top view of a structure illustrating the removal of the supporting pillars of the structure of FIG. 15.

At step 114, the fins can be merged. For example, as illustrated in FIG. 13, a semiconductor material 1302, which can be silicon, germanium or silicon-germanium, can be epitaxially grown to merge the fins 304. In addition, the corresponding areas of this semiconducting material that are adjacent to the source and drain regions of the fins can be in-situ doped during the epitaxial growth process with appropriate dopants to expand the source and drain regions. For illustrative purposes, a top view of the structure 1300 is provided in FIG. 14.

At step 116, the supporting pillars can be etched. For example, as illustrated in structure 1500 of FIG. 15, a photoresist 1502 can be formed over the structure 1300 such that the areas of the structure 1300 in which the pillars 702 are disposed are left exposed. Here, a photolithographic process can be implemented so that the structure 1500 is exposed to appropriate light and the structure is developed to remove the pillars 702. Thereafter, the photoresist can be removed, thereby resulting in the structure 1600 illustrated in FIG. 16.

Figure 17:
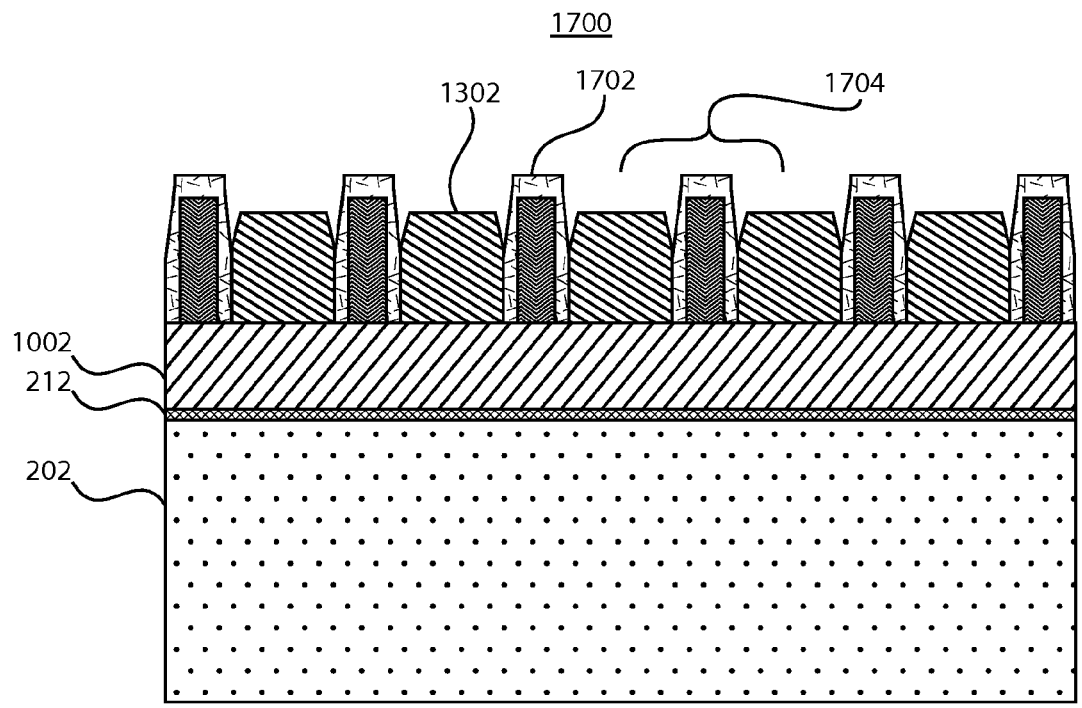
FIG. 17 is a cross-sectional side view illustrating the formation of gate structures and the completion of a system of multigate devices in accordance with an exemplary embodiment.
Figure 18:
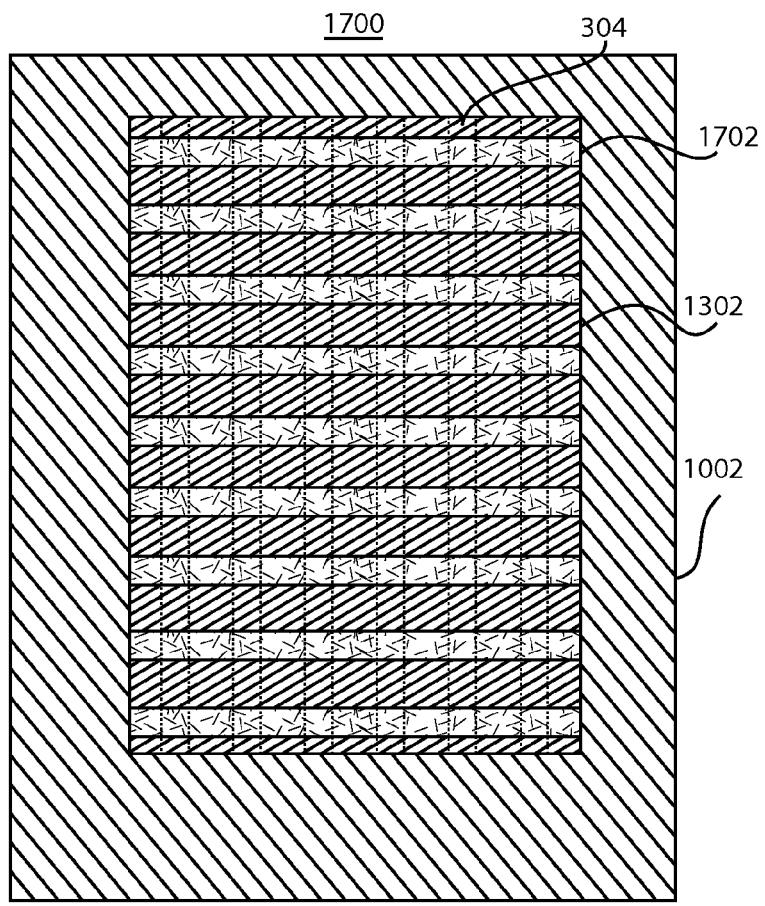
FIG. 18 is a top view of the structure illustrated in FIG. 17.

At step 118, gate structures can be formed over the fins to form the multigate devices. For example, as illustrated in structure 1700 of FIGS. 17 and 18, gate structures 1702 can be formed in place of each of the dummy gates 1102. For example, a dielectric material can be deposited over the entire structure 1600. Further, chemical-mechanical planarization can be implemented to reach the polysilicon surfaces of the dummy gates 1002. In addition, a wet etch can be performed to selectively remove the polysilicon material of the dummy gates 1102. Thereafter, high-k metal gates 1702 can be formed in the portions of the structure formally occupied by the dummy gates 1102. For example, a high-dielectric constant (high-k) gate dielectric can be overlaid on the fins 304 and a metal gate film can be overlaid on the gate dielectric. Further, polysilicon can be overlaid on the metal gate film to complete the gate electrodes of the gate structures 1702. As a result, fabrication of the multigate devices can be completed. Here, each gate structure 1702 envelops a plurality of surfaces of one or more fins 304. In addition, each gate structure 1702 can activate the conductive channel in a corresponding channel region 1212. As illustrated in FIG. 17, each fin 304 can have a plurality of multigate devices 1704 and the wafer structure 1700 can have a plurality of such fins, as illustrated in FIG. 18. In accordance with one exemplary embodiment, the structure 1700 can be a system of multigate devices 1704 that form part of an integrated circuit. Alternatively, portions of the wafer can be cut to provide a plurality of semiconductor chips including the multigate devices 1704.

It should be noted that although each of the fins of the structure 1700 are fabricated in accordance with the isolation method 100, exemplary embodiments of the present invention may also include a system in which only a subset of the fins are isolated in accordance with the method 100 and another subset of fins are isolated by conventional methods. In addition, in accordance with other exemplary aspects, some fins may be merged to form one device, while other fins may be separately merged to form another device. Here, the merging can merge fins formed in accordance with the method 100 with fins in which junction isolation is implemented in accordance with conventional methods. Further, the aspects of the present invention described above can be applied to form an inverter, where, for example, an N-FinFET is dielectrically isolated by the method 100 and a P-FinFET is also dielectrically isolated by the method 100. Alternatively, one of the N-FinFET and the P-FinFET can be dielectrically isolated in accordance with the method 100 while the other of the N-FinFET and the P-FinFET is junction isolated in accordance with a different method. Of course, optional merging, if employed, would have separate epitaxial merges for the N-FinFET and the P-FinFET.

Having described preferred embodiments of systems, methods and devices implementing multigate device isolation on bulk semiconductor substrates (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a multigate device comprising:
forming a fin on a semiconductor substrate including a carbon-doped semiconductor layer;
removing a first portion of semiconductor material that is beneath the fin to form a void beneath the fin by etching the material such that the fin is supported by at least one supporting pillar of the semiconducting material and such that the carbon-doped semiconductor layer prevents the etching from removing at least a portion of the fin;
depositing a dielectric material in said void to isolate the fin from a second portion of semiconductor material that is below said void; and
forming source and drain regions in said fin and forming a gate structure over the fin to fabricate the multigate device such that the dielectric material reduces current leakage beneath said device.

2. The method of claim 1, wherein a height of the fin is maintained throughout the removing of the first portion of semiconductor material beneath the fin.

3. The method of claim 1, wherein the carbon-doped semiconductor layer is a first carbon-doped semiconductor layer, wherein the semiconductor substrate includes a second carbon-doped semiconductor layer that prevents the etching from removing at least a portion of the semiconductor substrate beneath the second carbon-doped semiconductor layer and enables a consistent deposition of said dielectric material during said depositing.

4. The method of claim 3, wherein said method further comprises:
epitaxially growing, to form said semiconductor substrate, said first and second carbon-doped semiconductor layers over a bulk semiconductor substrate.

5. The method of claim 4, wherein said growing further comprises epitaxially growing a first semiconductor layer on top of said second carbon-doped semiconductor layer such that said first semiconductor layer is disposed between said first and second carbon-doped semiconductor layers, wherein said growing further comprises epitaxially growing a second semiconductor layer above said first carbon-doped semiconductor layer and wherein said fin is formed in said second semiconductor layer.

6. The method of claim 1, wherein the dielectric material reduces current leakage beneath a channel region between the source and drain regions.

7. The method of claim 1, wherein the dielectric material reduces current leakage through source and drain junctions of said source and drain regions.

8. The method of claim 1, further comprising;
removing said at least one supporting pillar to form the multigate device.

9. The method of claim 1, further comprising:
merging said fin with other fins formed on the substrate by growing additional semiconductor material between the fins.

10. A multigate device comprising:
a fin including a source, a drain and a channel region that provides a conductive channel between the source and the drain of the fin;
a gate structure enveloping a plurality of surfaces of the fin that is configured to activate said conductive channel;
a carbon-doped semiconductor layer beneath said fin; and
a dielectric material beneath said carbon-doped semiconductor layer that is configured to prevent current leakage beneath the device.

11. The device of claim 10, wherein said carbon-doped semiconductor layer is a first carbon-doped semiconductor layer and wherein the device further comprises:
a second carbon-doped semiconductor layer beneath said dielectric material.

12. The device of claim 11, wherein the dielectric material is a deposition oxide and wherein the second carbon-doped material has a consistent height beneath the fin to reduce an incidence of voids in said deposition oxide.

13. The device of claim 10, wherein said fin is merged with other fins through an epitaxially grown semiconductor material.

14. The device of claim 13, wherein said first carbon-doped semiconductor layer is disposed beneath said other fins.

15. The device of claim 10, wherein the dielectric material reduces current leakage beneath at least one of a channel region between the source and the drain, a drain junction of said drain or a source junction of said source.

16. A multigate system comprising:
a plurality of multigate devices, wherein each of the devices includes
a fin including a source, a drain and a channel region that provides a conductive channel between the source and the drain of the device, and
a gate structure enveloping a plurality of surfaces of the fin that is configured to activate said conductive channel;
a dielectric material beneath each of the fins that is configured to prevent current leakage beneath the devices; and
a carbon-doped semiconductor layer beneath said dielectric material.

17. The system of claim 16, wherein said carbon-doped semiconductor layer is a first carbon-doped semiconductor layer and wherein each of the devices further comprises:
a second carbon-doped semiconductor layer between said fins and said dielectric material.

18. The system of claim 16, wherein the dielectric material is a deposition oxide, wherein said carbon-doped semiconductor layer has a consistent height beneath said dielectric material and wherein the consistent height of said carbon-doped semiconductor layer reduces an incidence of voids in said deposition oxide.

19. The system of claim 16, wherein said fins are merged with an epitaxially grown semiconductor material.

20. The system of claim 16, wherein the dielectric material reduces current leakage beneath at least one of respective channel regions between the sources and the drains, drain junctions of said drains or source junctions of said sources.

* * * * *